United States Patent [19]
Schuelein

[11] Patent Number: 5,870,326
[45] Date of Patent: Feb. 9, 1999

[54] INFORMATION ENCODING BY MULTIPLE LINE SELECTION

[75] Inventor: Mark E. Schuelein, Tempe, Ariz.

[73] Assignee: Intel Corporation, Santa Clara, Calif.

[21] Appl. No.: 909,671

[22] Filed: Aug. 12, 1997

[51] Int. Cl.[6] .............................. G11C 17/00; G11C 7/00
[52] U.S. Cl. .......................... 365/94; 365/104; 365/203
[58] Field of Search ............................. 365/94, 104, 203

[56] References Cited

U.S. PATENT DOCUMENTS

| | | | |
|---|---|---|---|
| 4,206,507 | 6/1980 | Payling | 365/94 |
| 4,811,301 | 3/1989 | Houston | 365/203 |
| 4,899,308 | 2/1990 | Khan | 365/104 |
| 5,598,365 | 1/1997 | Shoji | 365/104 |
| 5,625,586 | 4/1997 | Yamasaki et al. | 365/104 |

*Primary Examiner*—David Nelms
*Assistant Examiner*—Trong Phan
*Attorney, Agent, or Firm*—Blakely, Sokoloff, Taylor & Zafman LLP

[57] ABSTRACT

An improved storage circuit that allows multiple bits to be encoded and stored using a single storage element. The encoded information is defined by a coupling made between a transistor as the storage element and any one of several bit lines associated with the transistor. When the coupled bit line is discharged in response to a wordline signal, the stored information can be captured by an encoder. The circuit is particularly useful for efficiently storing information in a gate array integrated circuit, because the gate array has more space around each transistor to add bit lines than a conventional, densely packed, ROM.

8 Claims, 4 Drawing Sheets

INFORMATION ENCODING BY MULTIPLE LINE SELECTION

BACKGROUND

1. Field of the Invention

The invention is generally related to storage of binary signals in semiconductor integrated circuits, and more particularly to programmable circuits such as read only memories (ROM) and gate arrays.

2. Background Information

A need exists today for denser and faster electronic structures for storing binary signals. Conventional techniques for storing information in semiconductor integrated circuits (ICs) include the use of random access memory (RAM), and read only memory (ROM). In particular, ROMs are used to store binary signals in the form of 1 bit per site, in an array of sites where each site is defined as the area near an active element.

A particular prior art ROM 100 is illustrated in FIG. 1. The ROM 100 includes an array of a large number of programmable sites 111, 112, . . . located at and near the crossing of a row conductor (wordline) and a column conductor (bit line). In particular, FIG. 1 illustrates a metal oxide semiconductor (MOS) ROM structure in which an n-channel field effect transistor (FET) as the active element is located at each site.

The ROM 100 is programmed by the IC manufacturer according to a customer's specifications by making or not making an electrical coupling 117 between the drain of a FET 118 and its corresponding bit line 119. The site 111 may therefore represent 1 bit of programmed information. The bit is accessed by first precharging the bit line 119 to a given voltage (normally a voltage near the rail supply voltage of the ROM IC) with the FET 118 being turned "off" so as to present a sufficiently high impedance to develop the given voltage. Then, the voltage on the wordline 110 is raised. The wordline 110 is coupled to the gate of the FET 118. Raising the potential on the wordline 110 will turn "on" the FET 118 by creating a sufficiently low impedance which then discharges the bit line 119 to a different voltage (normally a voltage close to the common return of the ROM IC). The information that has been programmed into the site 111 may then be read at the output as a first logic level if the coupling 117 is present, or a different logic level if the coupling 117 is not present. The above precharge and discharge cycle is repeated for each row of the ROM 100 to read the entire array.

The structure of FIG. 1 described above is known as a NOR-type ROM with metal programmable couplings. Other NOR-type ROMs exist that perform substantially the same function of encoding 1 bit per site, except that the programming step involves making or not making the FET 118 itself, rather than making or not making a metal coupling to the drain of an existing FET. It may be seen, however, that in either situation, one FET is employed to encode 1 bit. In practice, ROM structures of the type shown in FIG. 1 may be manufactured to exhibit very high density levels by designing the FETs to be very small so that the FETs and bit lines are closely placed together in the array.

Another type of solid state structure that may be used to store binary signals is the gate array. The gate array is a versatile logic IC which may be hardwire-programmed to perform a desired logic function and thus provide a higher level of functionality than the ROM. In essence, the gate array also has an array-type structure similar to the ROM 100 illustrated in FIG. 1, except that each gate array site is typically much larger than the site 111 in the ROM 100, because each gate array site will typically include several transistors and/or even a small logic processing unit with multiple input and output lines for each site.

Although the gate array is typically used to implement logic functions, a portion of a gate array may be used to implement a ROM by programming 2 bits into each site of the gate array using two n-channel transistors in each site. Each transistor may be programmed to connect or not connect with a single corresponding bit line.

Having discussed the density aspect of existing programmable storage circuits, the speed at which the stored signals may be read is also of importance. Referring to FIG. 1, the bit line 119 is attached (when so programmed) to the diffusion region (either the source or the drain, depending upon the supply voltages used) of the FET 118. Statistically, approximately one half of the FETs in a column may be coupled to the bit line after being programmed. Since ROM 100 may have thousands of wordlines, it is not unusual to have several thousand diffusion region couplings to the bit line 119. Since each coupling 117 adds capacitance to the bit line 119, the total capacitance on bit line 119 may be appreciable as compared to the discharging ability of a FET 118, such that discharging the bit line 119 through a single FET 118 will present a measurable delay while reading out the stored information from the ROM 100. Such a delay increases when thousands of wordlines are being selected sequentially. Therefore, given the above discussion concerning the operation of prior art storage circuits, an improvement in their speed and density is desirable.

SUMMARY

This invention is directed at a storage circuit having multiple storage sites, in which each site has an active element and is programmable to couple any one of a number of bit lines to the active element.

BRIEF DESCRIPTION OF THE DRAWINGS

These as well as other aspects and features of the invention will be better understood by referring to the drawings, detailed description, and claims below, where:

DETAILED DESCRIPTION

Figure 1:
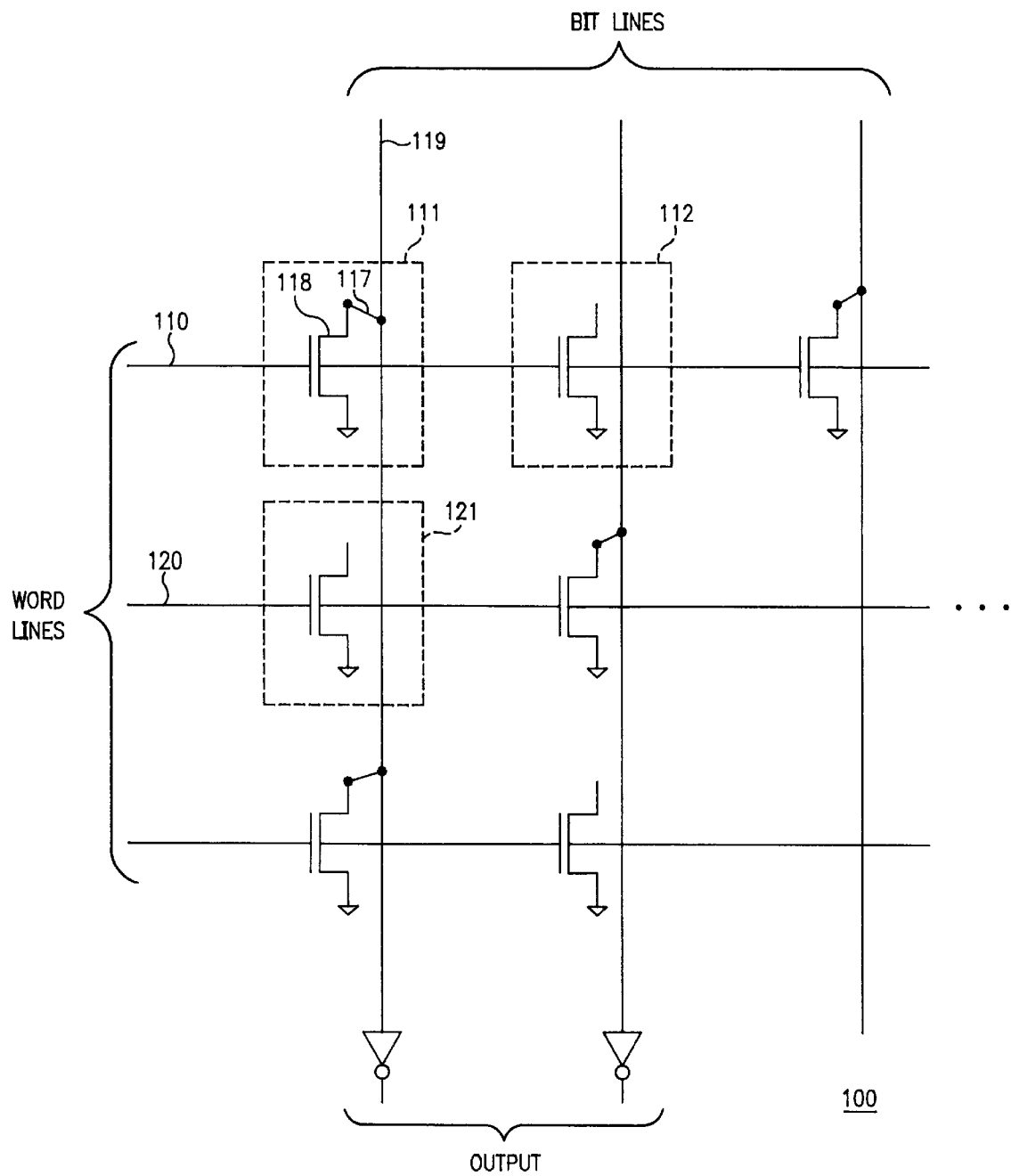
FIG. 1 illustrates a conventional ROM-type circuit.
Figure 2:
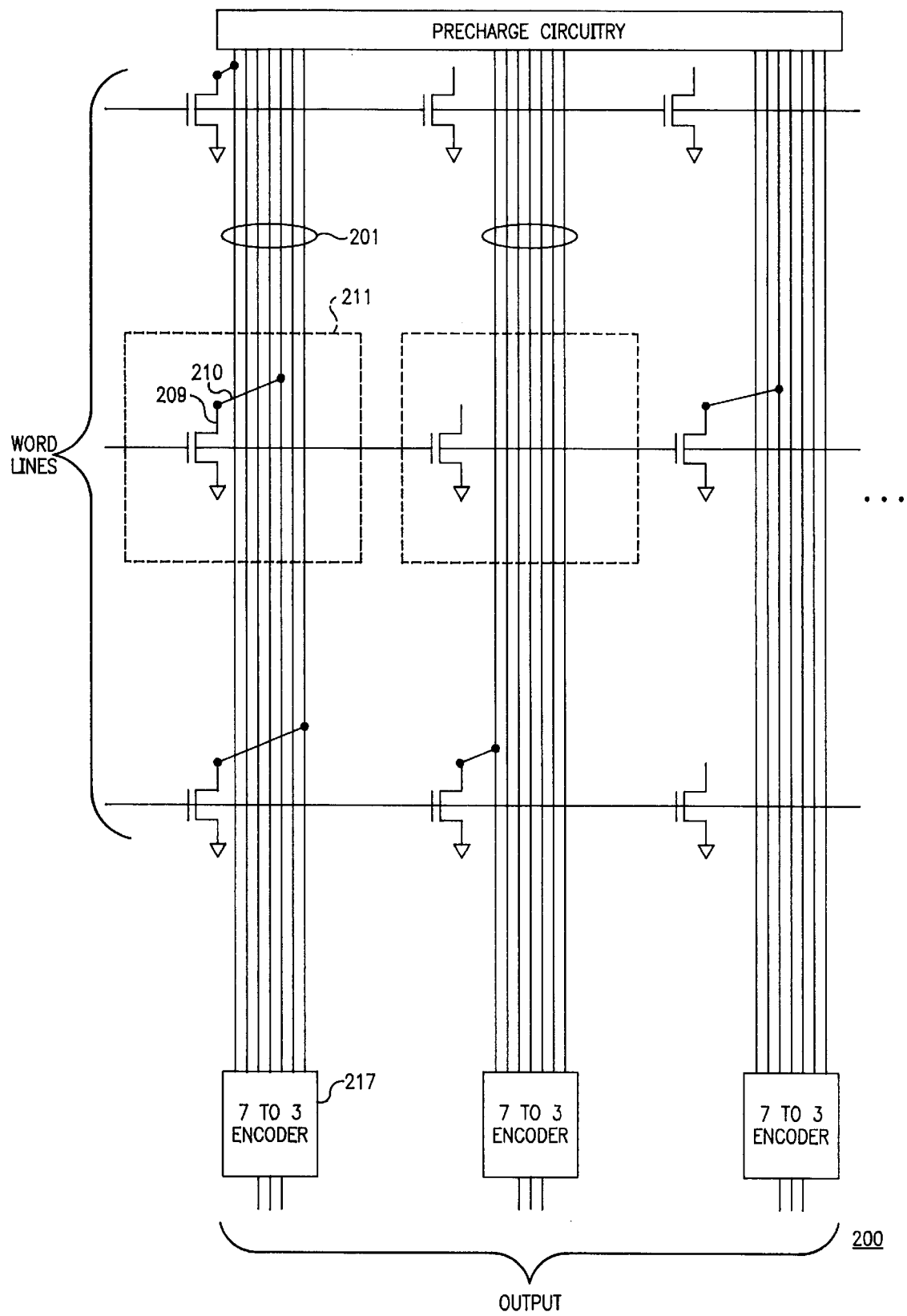
FIG. 2 illustrates a first embodiment of the storage circuit of the invention.

FIG. 2 illustrates an improved and novel storage circuit according to a first embodiment of the invention. The circuit 200 features an array of storage sites such as site 211, where the site 211 is the area near an active element depicted as an n-channel FET 209 for this embodiment. The site 211 also features an input line coupled to the gate of the n-channel FET 209. The site 211 may be programmed by making or not making an electrical coupling 210 to any one of the several bit lines in group 201 which cross the site 211. Alternatively, the site 211 may be programmed by making or not making the active element itself. Additionally, the embodiment of the circuit 200 contains an encoder circuit 217 coupled to each bit line group 211, where in this embodiment the encoder 217 is configured to encode 8 different combinations of signals on the 7 member group 201 into a 3-bit digital output.

In operation, the couplings at the various sites of the first embodiment are fabricated according to known IC manufacturing techniques. A commonly used technique for manufacturing the circuit 200 includes the following steps. A transistor layer defining an array of programmable storage sites is fabricated on a semiconductor substrate where each site contains a transistor, such as a FET 209, having at least one diffusion region. A metal connection, such as a metal strap, is fabricated to contact the diffusion region of each transistor. Also, the bit line group 201 is patterned and fabricated as crossing over the storage sites. A connection that loosely corresponds to electrical coupling 210, such as a via, may or may not be created (depending on the programmed value for each site) between the metal connection that connects the drain diffusion of the n-channel FET 209, and one of the members in the bit line group 201 crossing the site 211. The metal connection coupling the diffusion may appear on top of the patterned metal layer that includes the bit line group, or vice versa.

The different sites are located sufficiently apart such that the desired number of bit lines may be laid across each one. Furthermore, the fabrication process allows a metal contact between the outermost bit line in a group and the corresponding FET in the site. In the example above with a via between two layers of metal, the first layer may be the bit line group 201 while the second (upper) layer is the metal strap crossing the bit lines and coupling the drain diffusion region of the FET 209.

To read the programmed information, the bit line group 201 is precharged to a certain voltage, typically a voltage near the supply rail of the IC. After a predetermined delay, a desired wordline which couples the input line of site 211, as well as other sites in the same row, is activated such that the n-channel FETs in that row are substantially turned on providing a low impedance path to common ground. In this embodiment, the n-channel FET 209 acts substantially as an electronic switch and discharges a bit line of bit line group 201 to which it is coupled.

After another given delay, the digital 3-bit output signal may be read by a processing circuit (not shown) at the output port of the encoder 217. With seven input lines to the encoder 217, there can be 8 possible signals (7 having one coupling 210, and 1 with no coupling) such that a 3-bit output signal will properly encode the programmed value stored in each site. Thus, the site 211 including only one FET is programmed with 3 bits.

The number of output lines in the digital output port of the encoder for each column of the circuit 200 is equal to the mathematical expression $\log_2(N+1)$ where N is the number of bit lines in the bit line group. For example, for N=15, each site may be programmed to store 4 bits of information.

Encoder 217 may be implemented similar to conventional priority encoders, using conventional logic design and processing techniques. Further implementation details of the circuit 200 may be employed, such as the addition of a buffer or a sense amplifier to the encoder 217 or otherwise coupled to each member of the bit line group 201. Also, existing addressing schemes, together with new ones specifically tailored to the multiple bits per site topology of embodiments of the invention, may be used to generate the needed wordline signals and associate them with the multiple output lines for each column of the programmable circuit 200, for example.

Figure 3:
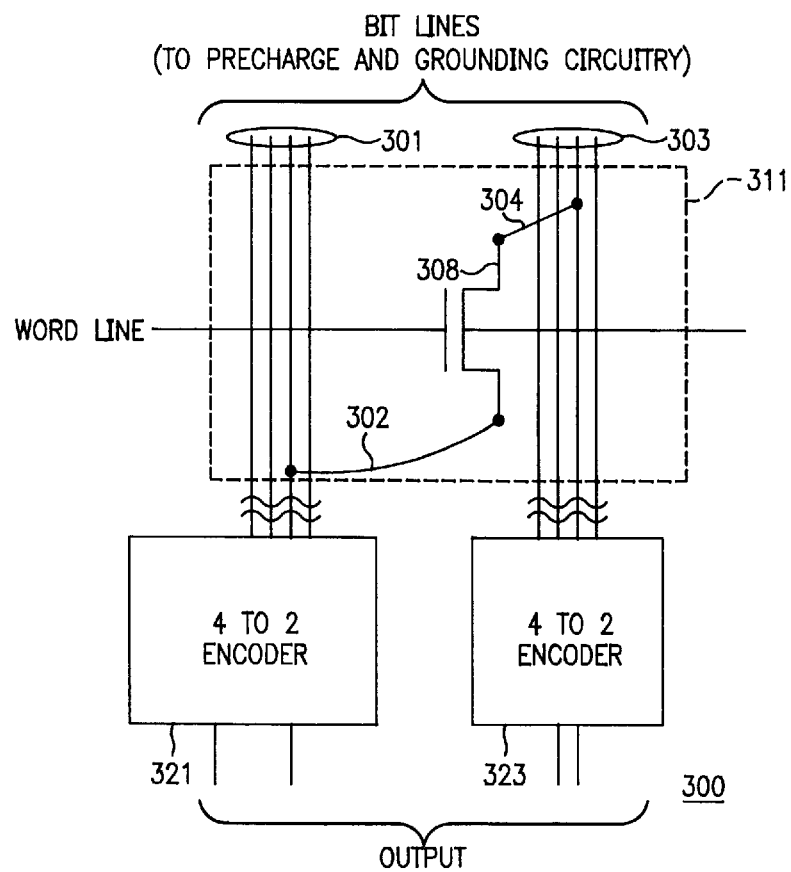
FIG. 3 illustrates a storage circuit and an encoder according to a second embodiment of the invention.

Another embodiment of the invention is illustrated as circuit 300 in FIG. 3, where the site 311 includes first and second bit line groups 301 and 303 instead of just a single group of bit lines. The advantage of placing a set of bit lines on either side of the FET is that the FET 308 may be used bi-directionally so that a greater number of bits may be encoded in the site 311 than for a site 211 having the same number of total bit lines. Encoders 321 and 323 are also provided to reduce the combination of 16 signals on 8 bit lines to 4 output bits representing 16 different programmed possibilities.

The existence of 16 different programmed possibilities in the embodiment of FIG. 3 for programming and reading the site 311 may be illustrated as follows. Each site 311 may be programmed by making couplings 302 and 304 to any one of the bit lines in each of groups 301 and 303. Once programmed, the group 301 is precharged to a predetermined voltage level (with wordline kept at a low voltage level for this embodiment such that the FET 308 is substantially turned off). Before the precharge of group 301, the potential of group 303 is lowered. Finally, the potential of wordline is raised to substantially turn on the FET 308. The encoder circuit 321 will then encode the programmed coupling 302 in the group 301 into a 2-bit output signal.

Likewise, the FET 308 may be operated in reverse, such that group 301 is coupled to a low potential (e.g., ground), and group 303 is precharged. The potential of wordline is raised, this time the encoder 323 reading the programmed coupling 304 into 2 output bits. Thus, a total of 4 bits are encoded per FET in the site 311.

Note that 4 bit lines are employed in this embodiment to encode 2 bits with bi-directional use of the FET 308, such that a total of 8 bit lines represented by groups 301 and 303 over each site are used to yield 4 bits per FET in each site. In general, the number of bits encoded in a site 311 for the embodiment of FIG. 3 is given by the mathematical relation $\log_2 M + \log_2 N$ where M and N are the number of bit lines run on either side of the FET.

Figure 4:
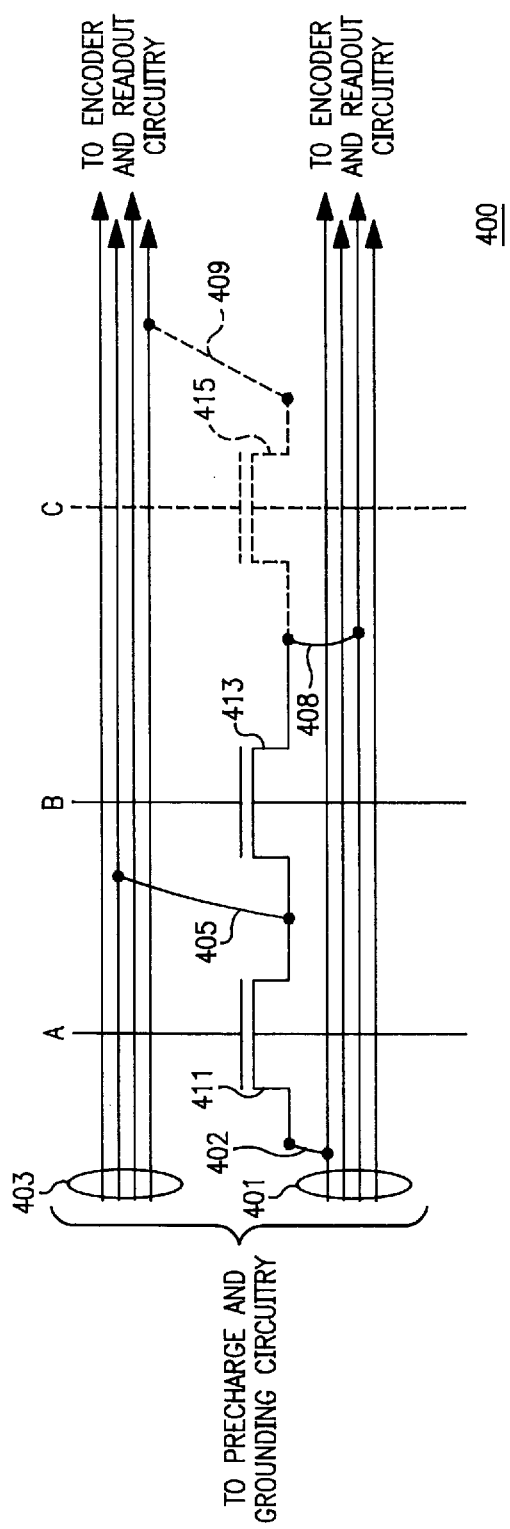
FIG. 4 illustrates a storage circuit according to a third embodiment of the invention.

Turning now to FIG. 4, a multiple-transistor storage circuit 400 is shown according to yet another embodiment of the invention. The circuit 400 includes a programmable storage site defined at and near a number of active elements, such as FETs 411 and 413 which share a common source diffusion region. A third FET 415 may be added, with FETs 415 and 413 sharing a common drain diffusion region. First and second bit line groups 401 and 403 traverse the circuit 400 on either side of the FETs as shown. The circuit 400 is programmed by making or not making an electrical coupling between a source/drain of an FET and alternating bit line groups.

Programmed couplings 402, 405, 408 and 409 are shown in the embodiment of FIG. 4 as coupling the drain of FET 411 to bit line group 401, the source of FET 411 and FET 413 to bit line group 403, the drain of FET 413 and FET 415 to bit line group 401, and finally the source of FET 415 to bit line group 403, respectively. Under this configuration, the circuit 400 may be read using several different procedures. For example, a first precharge operation on bit line group 401 would allow the programmed couplings at node 402 to be read by properly signaling line A after grounding bit line group 403. A second precharge operation on bit line group 401 would allow programmed coupling 408 to be read by signaling either B or C. Similarly, to read the programmed couplings at nodes 405 and 409, bit line group 403 would be precharged twice (with bit line group 401 grounded). The nodes 405 and 409 would be read by properly signaling lines B and C sequentially, after each precharge operation.

Although the above description and operation of the circuit 400 referred to specific drain and source regions for the various FETs, one skilled in the art will recognize that such references are merely used as an example to describe the regions when bit line group 401 is being precharged. Since the FETs are bi-directional, the regions labeled "source" and "drain" above will be operating as drain and source, respectively, when bit line group 403 is being precharged.

The circuit 400 in FIG. 4 featuring a set of 4 bit lines on either side of three FETs allows 8 bits of information to be encoded in the site. Of course, these 8 bits cannot be read simultaneously, but would rather appear 2 bits at a time following each precharge operation.

The embodiments of the invention in FIGS. 3 and 4 employ an approach in which a coupling is made to exactly one of the bit lines so that the FETs are never floating, although the invention is not limited in scope in this respect. Indeed, a storage circuit using the programmable site 211 may be used to store data without the coupling 210.

The various embodiments of the invention described above are particularly useful in implementing a ROM-type storage area in a gate array IC. In a gate array, the active elements (transistors) in each site have been defined, and the logic functions are programmed by making (or not making) electrical couplings among the active devices. Because the transistors in a gate array are typically several times larger than the transistors in a dedicated ROM IC, each transistor in a gate array typically has enough room on either side for several bit lines to traverse.

An encoding scheme according to FIG. 3 of the invention implemented in a gate array may store 4 times more information in a defined 2-dimensional area of the gate array than existing techniques that encode 1 bit per transistor per site in the gate array. Although a dedicated ROM array may be manufactured that would store the same amount of information using a smaller area, such a solution would include a separate dedicated ROM section to be added to the gate array IC, or alternatively a separate ROM chip. By using a portion of the existing gate array base as a memory more efficiently, the embodiments of the invention may provide a flexible solution for storage needs at a lower cost than conventional gate array implementations of ROM.

The embodiments previously described also reduce the capacitive loading on a bit line that is being discharged, as compared to the conventional single bit line per transistor topology. With multiple bit lines per transistor, there will be fewer programmed couplings to each bit line for an equal amount of information, and hence lower capacitive loading, because the encoded information is in a sense distributed over multiple bit lines. Lower capacitance on a bit line permits faster discharge through the single transistor, which will translate into a shorter delay for reading the information stored in a large array of the programmed sites.

The embodiments of the invention described above are, of course, subject to other variations in structure and implementation. For example, although an equal number of bit lines are employed in each group, any number of different combinations for grouping the bit lines in FIGS. 3 and 4 may be selected. Also, different sequences are possible for the precharge and discharge cycles of the bit lines as will be apparent to one skilled in the art. Thus, the details above should be interpreted as illustrative and not in a limiting sense.

What is claimed is:

1. A storage circuit comprising:

a first plurality of bit lines;

a plurality of sites, each site having an active element and being programmable to couple any one of the first plurality of bit lines to the active element; and a second plurality of bit lines, each site further being programmable to couple any one of said second plurality of bit lines to the active element, and each site when programmed being further configured to provide a low impedance path through the active element between a coupled one of said first plurality of bit lines and a coupled one of said second plurality of bit lines.

2. The storage circuit of claim 1 further comprising:

an encoder having an input coupled to said first and second plurality of bit lines, the encoder having an encoder output defining a plurality of output lines, the plurality of output lines being fewer than the first and second plurality of bit lines.

3. The storage circuit of claim 1 wherein the active element has a control input for receiving a wordline signal, the active element in response to receiving the wordline signal providing a low impedance path between a coupled one of the first plurality of bit lines and a common return node.

4. The storage circuit of claim 1 further comprising a precharge circuit for charging the first plurality of bit lines to a predetermined voltage level.

5. The storage circuit of claim 1 wherein the encoder output provides the programmed value of each site as a binary number on the plurality of output lines.

6. A circuit as in claim 1 wherein the active element is a first bi-directional FET having a gate, a source and a drain, the source and the drain each defining a separate diffusion region, each site when programmed having the coupled one of said first plurality of bit lines coupled to the source, and the coupled one of said second plurality of bit lines coupled to the drain.

7. A circuit as in claim 6 further comprising in at least one site a second bi-directional FET having a diffusion region shared with one of the source and drain diffusion regions of the first FET, the site when programmed further having an unshared diffusion region of the second FET coupled to a second coupled one of the second plurality of bit lines.

8. A circuit as in claim 1 wherein the plurality of sites are part of a gate array.

\* \* \* \* \*